(12) United States Patent
Amato

(10) Patent No.: US 7,538,443 B2
(45) Date of Patent: May 26, 2009

(54) OFFSET DEPENDENT RESISTOR FOR MEASURING MISALIGNMENT OF STITCHED MASKS

(75) Inventor: Joseph M. Amato, Beacon, NY (US)

(73) Assignee: NXP B.V., Eindhoven (NL)

(*) Notice: Subject to any disclaimer, the term of this patent is extended or adjusted under 35 U.S.C. 154(b) by 349 days.

(21) Appl. No.: 10/567,173

(22) PCT Filed: Jun. 25, 2004

(86) PCT No.: PCT/US2004/020573
§ 371 (c)(1),
(2), (4) Date: Feb. 3, 2006

(87) PCT Pub. No.: WO2005/004238
PCT Pub. Date: Jan. 13, 2005

(65) Prior Publication Data
US 2007/0030335 A1 Feb. 8, 2007

Related U.S. Application Data

(60) Provisional application No. 60/482,278, filed on Jun. 25, 2003.

(51) Int. Cl.
H01L 23/544 (2006.01)
G01B 7/00 (2006.01)
G01D 21/00 (2006.01)

(52) U.S. Cl. .................. 257/797; 257/E21.53; 438/14; 438/17; 33/645

(58) Field of Classification Search .................. 438/14, 438/17, 18; 33/613, 645; 324/699, 525; 257/797, E21.53
See application file for complete search history.

(56) References Cited

U.S. PATENT DOCUMENTS

| 3,808,527 | A | 4/1974 | Thomas |
| 5,861,679 | A | 1/1999 | Nagano |
| 5,998,226 | A | 12/1999 | Chan |
| 6,221,681 | B1 | 4/2001 | Sugasawara |
| 6,305,095 | B1 | 10/2001 | Look et al. |
| 6,323,097 | B1 | 11/2001 | Wu et al. |
| 6,393,714 | B1 | 5/2002 | Look et al. |
| 2001/0049881 | A1 | 12/2001 | Look et al. |

OTHER PUBLICATIONS

World Intellectual Property Organization, "PCT International Search Report(PCT/US2004/020573)," May 9, 2005.
World Intellectual Property Organization, "PCT International Preliminary Report on Patentability (PCT/US2004/020573)," Jan. 3, 2006.

*Primary Examiner*—Hsien-ming Lee

(57) ABSTRACT

A system and method for identifying misalignments in an overlapping region of a stitched circuit in an integrated circuit fabrication process. The method comprises: creating a first circuit using a reference mask, wherein first circuit includes a first part of an offset dependent resistor structure in the overlapping region; creating a second circuit using a secondary mask, wherein the second circuit includes a second part of the offset dependent resistor structure in the overlapping region, wherein the offset dependent resistor structure includes a plurality of nubs that interconnect the first part and the second part of theis offset dependent resistor structure; measuring a resistance across the offset dependent resistor structure; and determining an amount of misalignment based on the measured resistance.

23 Claims, 7 Drawing Sheets

OFFSET DEPENDENT RESISTOR FOR MEASURING MISALIGNMENT OF STITCHED MASKS

CROSS REFERENCE TO RELATED APPLICATION

This application claims the benefit of U.S. provisional application Ser. No. 60/482,278 filed Jun. 25, 2003, which is incorporated herein whole by reference.

The present invention relates to measuring misalignment of stitched masks in a semiconductor manufacturing process, and more specifically relates to a sensitivity enhanced matched offset dependent resistor structure for electrically measuring unidirectional misalignment of stitched masks for etched interconnect layers.

Most semiconductor devices are built using a number of material layers. Each layer is patterned to add or remove selected portions to form circuit features that will eventually make a complete integrated circuit. The patterning process, known as photolithography, defines the dimensions of the circuit features using masks that selectively block a light source.

As the complexity of integrated circuits increases, the number and size of circuits become larger and larger, often consuming an entire wafer. In Wafer Scale Integration (WSI), the retical of a standard mask is often too small to expose the entire wafer. In these cases, multiple masks must be used for a single layer in fabrication. Specifically, circuits created by a first mask are "stitched" together with circuits created by a second mask in an overlapping region. Misalignments in the stitching can cause detrimental effects, and it is therefore desirable to know when they occur.

Present methods for identifying misalignments include using a scanning microscope to study the device. This methodology is both time-consuming and costly, as the device must be etched to expose the stitched area, and then carefully studied to identify any misalignment. Accordingly, a need exists for a simplified process for identifying misalignments in stitched circuits.

The present invention addresses the above-mentioned problems, as well as others, by providing a set of offset dependant resistor structures formed in part by each of a reference mask and secondary mask. The resistor values will vary from an ideal value when an offset occurs and be equal to the ideal value when no offset exists. Detection is isolated to a single axis for each resistor structure, and the structure can be repeated in a compact design to offer ease of use and increased sensitivity to misalignment.

In a first aspect, the invention provides a method for identifying misalignments in an overlapping region of a stitched circuit in an integrated circuit fabrication process, comprising: creating a first circuit using a reference mask, wherein the first circuit includes a first part of an offset dependent resistor structure in the overlapping region; creating a second circuit using a secondary mask, wherein the second circuit includes a second part of the offset dependent resistor structure in the overlapping region, wherein the offset dependent resistor structure includes a plurality of nubs that interconnect the first part and the second part of the offset dependent resistor structure; measuring a resistance across the offset dependent resistor structure; and determining an amount of misalignment based on the measured resistance.

In a second aspect, the invention provides an offset dependent resistor structure for identifying a misalignment in an overlapping region of a stitched portion of an integrated circuit, comprising: a first part of an offset dependent resistor structure created in the overlapping region using a reference mask; a second part of the offset dependent resistor structure superimposed on the first part in the overlapping region using a secondary mask; and a plurality of nubs that interconnect the first part and the second part of the offset dependent resistor structure to form a single electrical pathway, wherein the resistance of the single electrical pathway is dependent upon the length of the nubs that interconnect the first part and the second part of the offset dependent resistor structure.

In a third aspect, the invention provides a system for measuring misalignments in an overlapping region of a stitched portion of an integrated circuit, comprising: an offset dependent resistor structure, including: a first part created in the overlapping region using a reference mask, a second part superimposed on the first part in the overlapping region and created using a secondary mask, and a plurality of nubs oriented in a first uniform direction that interconnect the first part and the second part to form a single electrical pathway, wherein the resistance of the single electrical pathway is dependent upon the length of the nubs that interconnect the first part and the second part; and a system for measuring the resistance across the single electrical pathway.

In a fourth aspect, the invention provides a method for identifying misalignments in an overlapping region of a stitched circuit in a integrated circuit fabrication process, comprising: creating a first circuit using a reference mask, wherein first circuit includes in the overlapping region a first part of a first offset dependent resistor structure and a first part of a second offset dependent resistor structure; creating a second circuit using a secondary mask, wherein the second circuit includes in the overlapping region a second part of the first offset dependent resistor structure and a second part of the second offset dependent resistor structure, wherein the first offset dependent resistor structure includes a plurality of first nubs that FIG. 4 will have a greater resistance than structure 12 of FIG. 3.

FIG. 5 depicts the case where the second part 26 is misaligned downward and to the left of the first part 26. As can be seen, the exposed length of the nubs 24 has decreased relative to the ideal length of FIG. 3. In this case, the electrical pathway is shorter, and therefore the structure 12 in FIG. 4 will have less resistance than the structure of FIG. 3.

Increased sensitivity is achieved by providing an offset resistor structure that includes a plurality of interface nubs 42 along the pathway. In this embodiment, four nubs 42 are utilized, with each of the nubs 42 adding or reducing the overall length of the pathway when a vertical misalignment occurs. Thus, the sensitivity of the structure is increased by a factor of four. It should be understood that the structure 12 measures misalignment in a single direction (e.g., vertical). To identify a misalignment in a second direction (e.g., horizontal) a second structure 12 may be used, except that it must be oriented in the desired direction, e.g., perpendicularly to the first, as shown in FIG. 1 (see, 12a vs. 12b).

FIGS. 6-9 depict a second implementation of an offset dependent resistor structure 14 (i.e., structures 14a and 14b of FIG. 1). In this embodiment, a first part 20 created by interconnect the first part and the second part of the first offset dependent resistor structure, wherein the second offset dependent resistor structure includes a plurality of second nubs that interconnect the first part and the second part of the second offset dependent resistor structure, and wherein the first and second nubs are oriented in a uniform direction; measuring a resistance across both the first and second offset dependent resistor structures; and determining an amount of misalignment based on the measured resistances.

These and other features of this invention will be more readily understood from the following detailed description of the various aspects of the invention taken in conjunction with the accompanying drawings in which.

Figure 1:
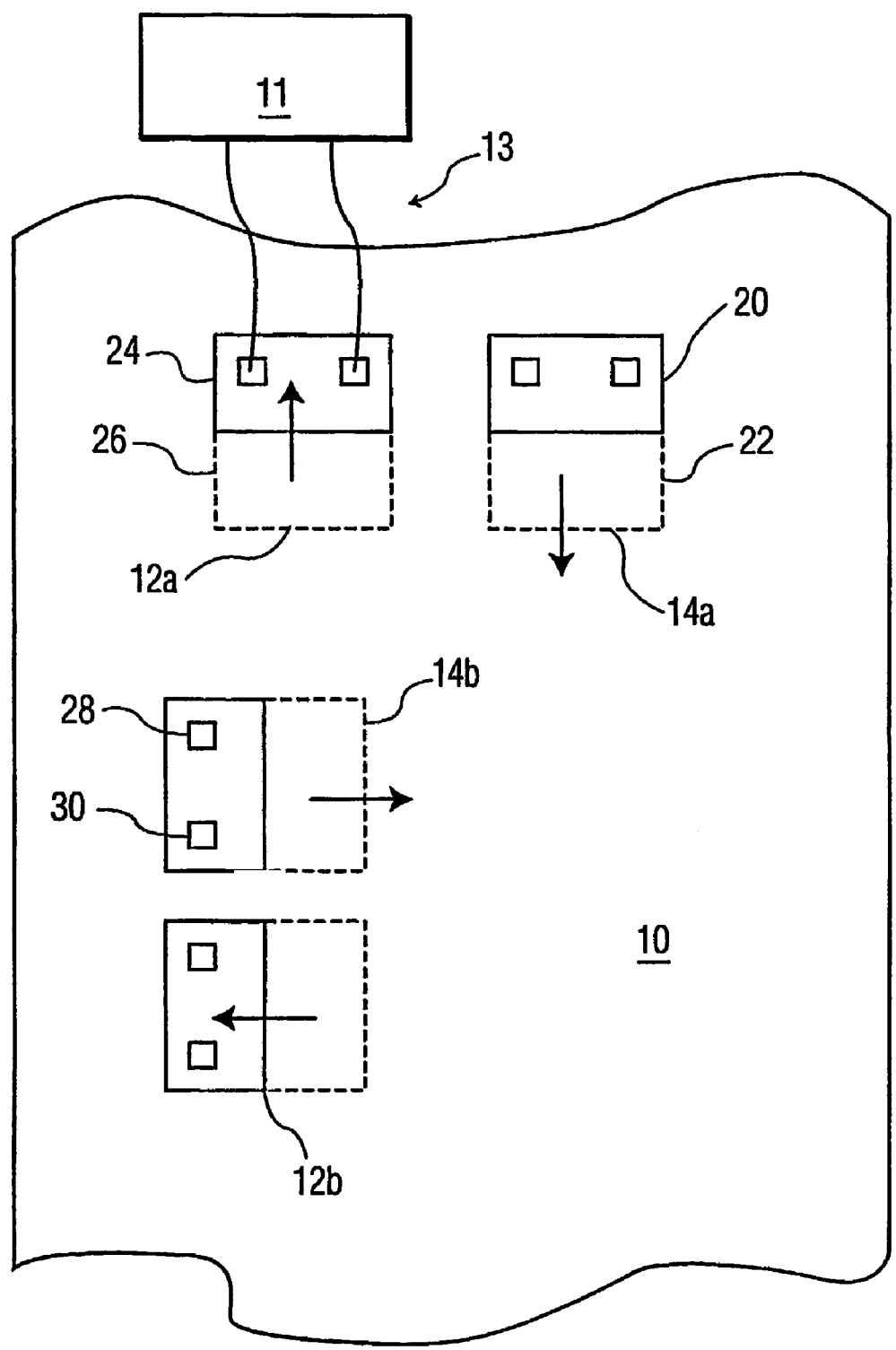
FIG. 1 depicts an overlapping region of an integrated circuit chip in accordance with the present invention.

Referring now to the drawings, FIG. 1 depicts a portion of an overlapping region 10 of an integrated circuit chip. In the overlapping region 10, a first set of circuit features may be created using a reference mask, and a second set of circuit features may be created using a secondary mask (not shown). Accordingly, some of the circuit features of both must be "stitched" together to integrate the circuits laid down by the reference mask and the secondary mask. In this exemplary embodiment, four offset dependant resistor structures 12a, 12b, 14a and 14b are utilized to determine any misalignment between the circuits.

Structures 12a and 12b are implemented using a first embodiment (described in more detail below with regard to FIGS. 2-5) that includes a first part 24 created by the primary mask and a second part 26 created by a secondary mask. Structures 12a and 12b provide an increased resistance when the second part 26 is misaligned towards the first part 24 (i.e., a positive misalignment as shown by the directional arrows).

Structures 14a and 14b are implemented using a second embodiment (described in more detail below with regard to FIGS. 6-9) that includes a first part 20 created by the primary mask and a second part 22 created by a secondary mask. Structures 14a and 14b provide an increased resistance when the second part 22 is misaligned away the first part 20 (i.e., a negative misalignment as shown by the directional arrows).

Accordingly, structures 12a and 14a measure misalignment in the up-down directions, while structures 12b and 14b measure misalignment in the left-right direction. It should be understood that while the exemplary embodiment of FIG. 1 depicts the use of four offset dependant resistor structures, the invention could be implemented using as few as one structure or as many as desired. Each of the structures 12a, 12b, 14a and 14b include test pads 28, 30 (or any other connection structure) for measuring the resistance. In one exemplary embodiment, a test system 11 may be utilized with probes 13 to measure the resistance, compare it to an ideal value representative of a zero misalignment, and calculate a misalignment. In an alternative embodiment, the structures 12a, 12b, 14a and 14b could be connected to on-board circuitry, which could capture and report the resistance value and/or amount of misalignment, e.g., using an operational amplifier.

Figure 2A:
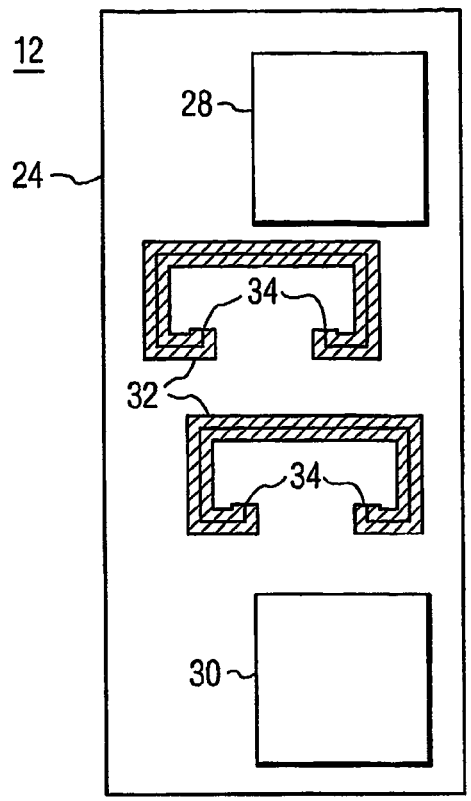
FIG. 2A depicts a first portion of an offset dependant resistor structure created by a first mask in accordance with the present invention.
Figure 2B:
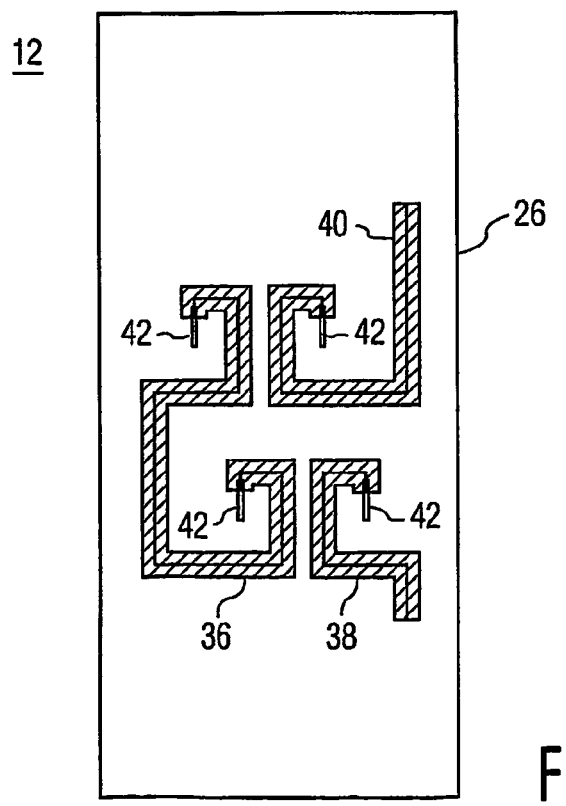
FIG. 2B depicts a second portion of the offset dependant resistor structure created by a second mask in accordance with the present invention.

Referring now to FIGS. 2A, 2B and 3-5, a further description of the first type of offset dependant resistor structure 12 (i.e., 12a and 12b of FIG. 1) is shown. FIG. 2A depicts the first part 24 of structure 12 created by a reference mask and FIG. 2B depicts the second part 26 of the structure 12 created by a secondary mask. First part 24 includes a pair of open rectangular substructures 32, each having two interface points 34. First part also includes a pair of test pads 28 and 30. Second part 26 includes three substructures 36, 38 and 40 that have four interface nubs 42.

Figure 3:
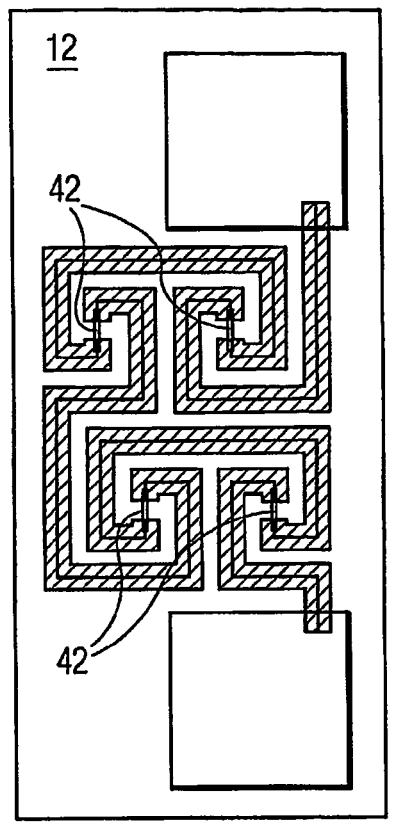
FIG. 3 depicts first and second portions of FIGS. 2A and 2B superimposed with no offset.
Figure 4:
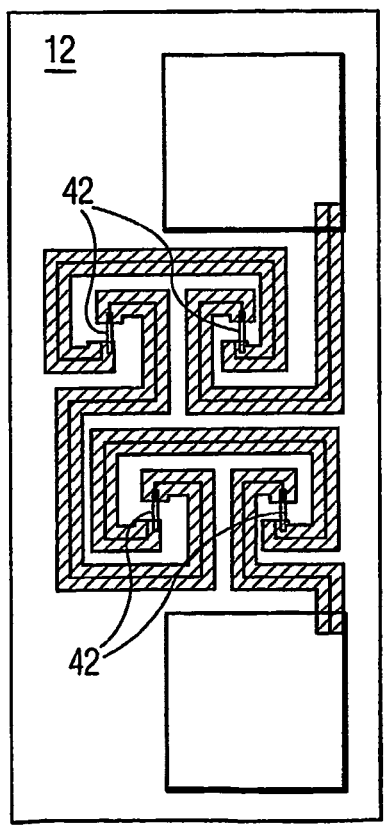
FIG. 4 depicts first and second portions of FIGS. 2A and 2B superimposed with a positive offset.
Figure 5:
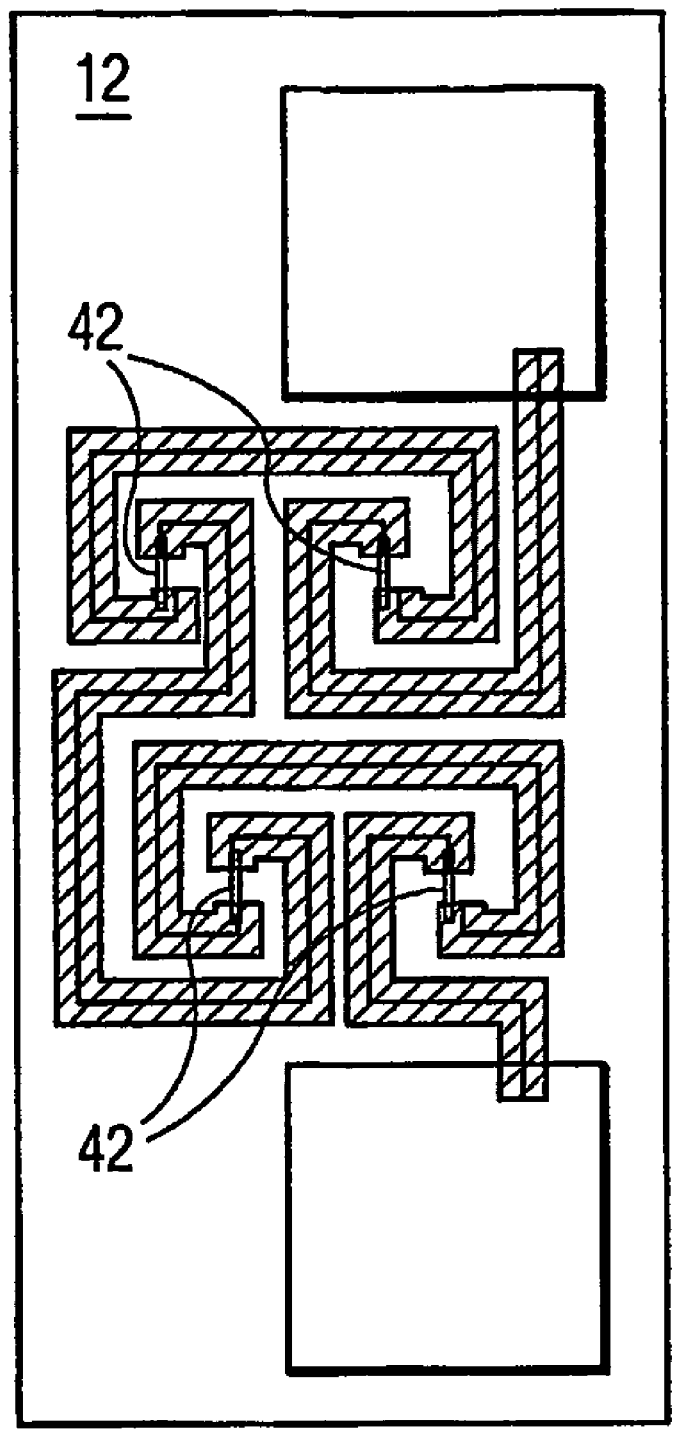
FIG. 5 depicts first and second portions of FIGS. 2A and 2B superimposed with a negative offset.

FIGS. 3-5 depict three cases of offset dependent resistor structure 12 having the second part 26 superimposed on the first part 24. As can be seen, when the substructures of both parts are laid down, a single electrical pathway is created between the test pads. The structure includes four nubs 42 that interface the two parts. Because of the design of the substructures, an up or down misalignment or offset will require more or less of each nub 42 to be used, resulting in either a longer or shorter electrical pathway. As is generally known, the longer the pathway, the greater the resistance. Accordingly, by measuring the resistance through the pathway, a relative amount of vertical misalignment can be ascertained.

More specifically, a relative increase in resistance occurs when the second part 26 is misaligned toward the first part 24 (positive misalignment), and a relative decrease in resistance occurs when the second part 26 is misaligned away from the first part 24 (negative misalignment). The case depicted in FIG. 3 depicts the ideal case where no misalignment occurs. That is, the exposed length of the interface nubs 42 between the substructures 34 of the first part and the substructures 36, 38 and 42 of the second part matches an "ideal" length.

Figure 6A:
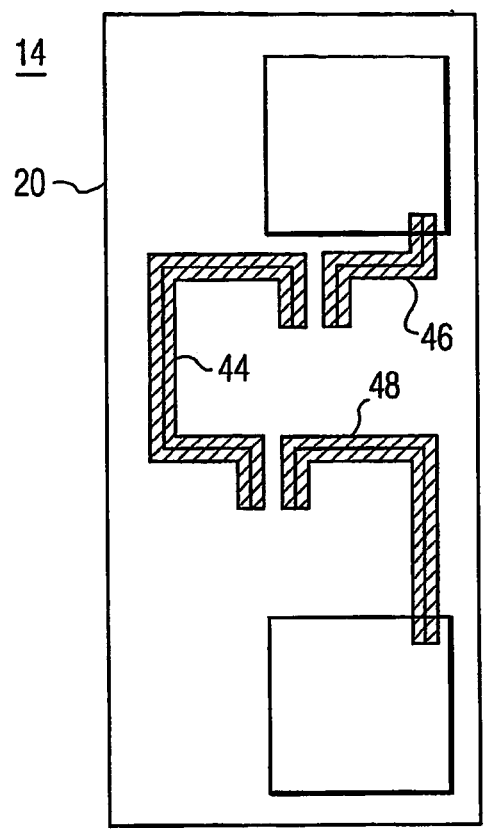
FIG. 6A depicts a first portion of a second offset dependant resistor structure created by a first mask in accordance with the present invention.
Figure 6B:
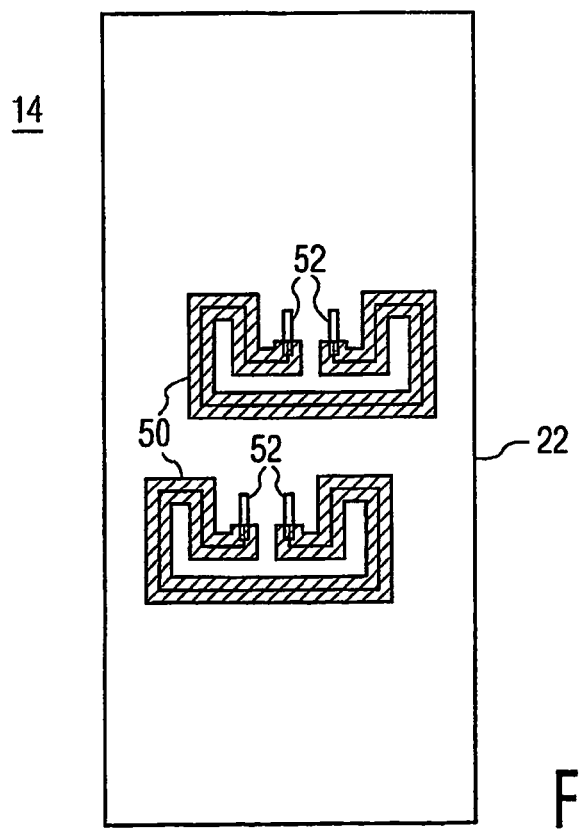
FIG. 6B depicts a second portion of the second offset dependant resistor structure created by a second mask in accordance with the present invention.
Figure 7:
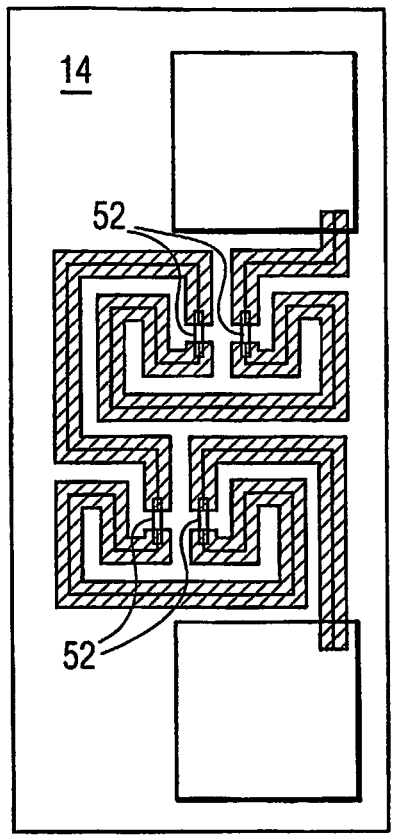
FIG. 7 depicts first and second portions of FIGS. 6A and 6B superimposed with no offset.
Figure 8:
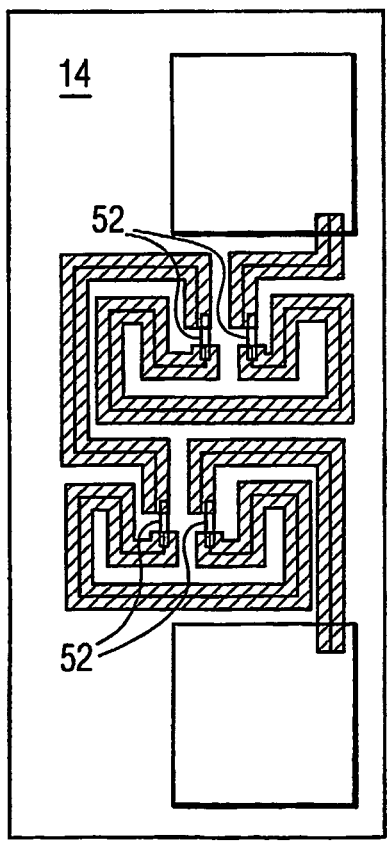
FIG. 8 depicts first and second portions of FIGS. 6A and 6B superimposed with a positive offset.
Figure 9:
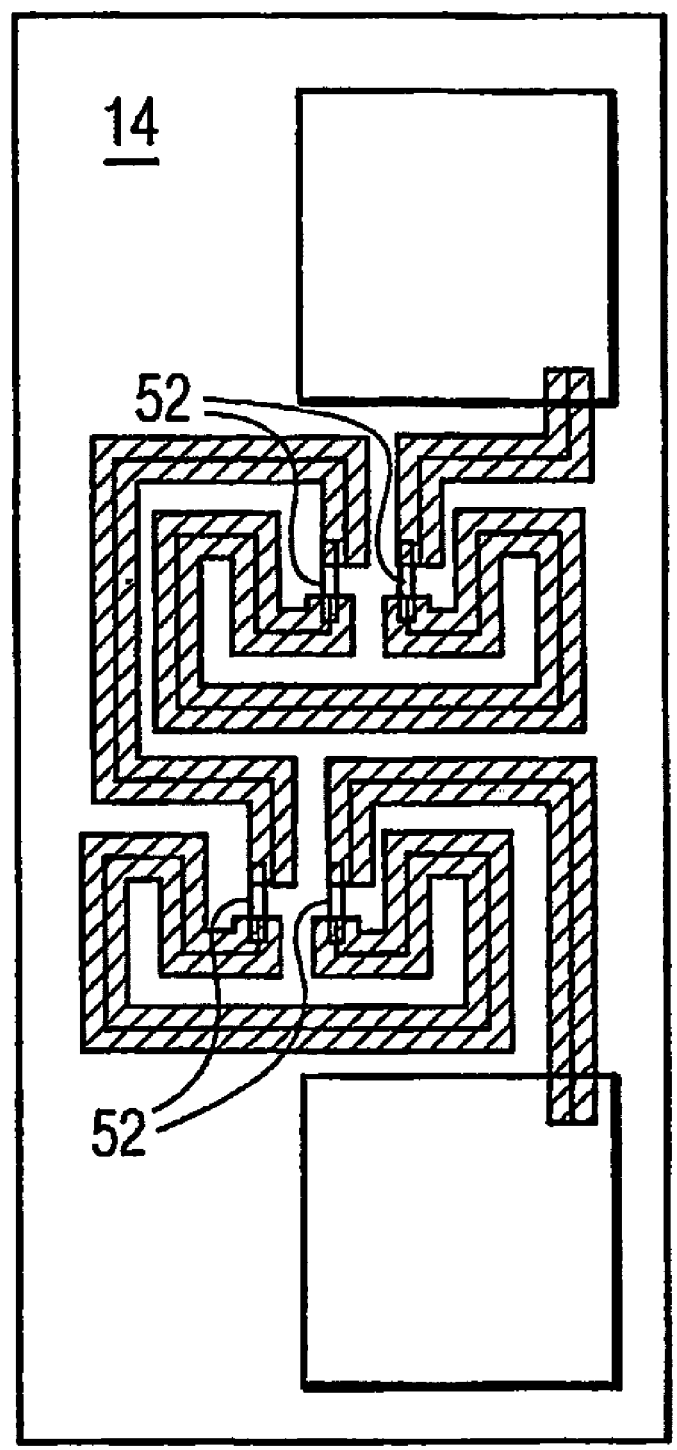
FIG. 9 depicts first and second portions of FIGS. 6A and 6B superimposed with a negative offset.

FIG. 4 depicts the case where the second part 26 is misaligned upward and to the right of the first part 26. As can be seen, the exposed length of the nubs 24 has increased relative to the ideal length of FIG. 3. In this case, the electrical pathway is longer, and therefore structure 12 in a reference mask is shown in FIG. 6A and includes a pair of test pads and three substructures 44, 46 and 48. A second part 22 created by a secondary mask includes a pair of E-shaped substructures 50. Each E-shaped substructure 50 includes a pair of nubs 52. FIGS. 7-9 depict three cases in which the second part 22 has been superimposed on the first part 20. FIG. 7 depicts the zero offset case where the exposed portion of each nub 52 is an ideal length. FIG. 8 depicts the case where the second part 22 is misaligned upward and to the right relative to the first part 20. In this case, the exposed portion of each nub 52 is smaller relative to the ideal case, thereby creating a relatively lower resistance. FIG. 9 depicts the case where the second part 22 is misaligned downward and to the left relative to the first part 20. In this case, the exposed portion of each nub 52 is larger relative to the ideal case, thereby creating a relatively greater resistance.

Similar to offset dependent resistor structure 12, offset dependent resistor structure 14 includes four nubs to provide increased sensitivity. However, structure 14 shown in FIGS. 6-9 differs from the offset dependent resistor structure 12 shown in FIGS. 2-5 in that structure 14 generates a relatively lower resistance when the second part 22 is misaligned towards the first part 20 (positive misalignment), and generates a relatively higher resistance when the second part 22 is misaligned away from the first part 20 (negative misalignment).

Note however that in the ideal cases shown in FIGS. 3 and 7, structures 12 and 14 are electrically equivalent, i.e., they have the same resistive values. In particular, both ideal structures have the same number of turns and the same overall pathway length. Thus, when a positive offset occurs, the resistance value of structure 12 will increase by the same amount as the resistive value of structure 14 will decrease. Obviously, the overall arrangement of the substructures can be altered to produce similar results, and such alterations fall within the scope of this invention.

The foregoing description of the preferred embodiments of the invention has been presented for purposes of illustration and description. They are not intended to be exhaustive or to limit the invention to the precise form disclosed, and obviously many modifications and variations are possible in light of the above teachings. Such modifications and variations that are apparent to a person skilled in the art are intended to be included within the scope of this invention as defined by the accompanying claims.

The invention claimed is:

1. A method for identifying misalignments in an overlapping region of a stitched circuit in an integrated circuit fabrication process, comprising:
   creating a first circuit using a reference mask, wherein the first circuit includes a first part of an offset dependent resistor structure in the overlapping region;
   creating a second circuit using a secondary mask, wherein the second circuit includes a second part of the offset dependent resistor structure in the overlapping region,
   wherein the offset dependent resistor structure includes a plurality of nubs that interconnect the first part and the second part of the offset dependent resistor structure;
   measuring a resistance across the offset dependent resistor structure; and
   determining an amount of misalignment based on the measured resistance;
   wherein:
   one of the parts of the offset dependent resistor structure comprises a pair of open rectangular substructures, each having two open terminal points; and
   the other part of the offset dependent resistor structure comprises three substructures that interconnect with the open terminal points of the rectangular substructures to form a single electrical pathway when the first and second parts are superimposed.

2. The method of claim 1, wherein one of the parts of the offset dependent resistor structure comprises a pair of test pads.

3. The method of claim 1, wherein the first part and the second part of the offset dependent resistor structure interconnect via four nubs, wherein each nub is oriented in a uniform direction.

4. The method of claim 3, wherein:
   a zero misalignment in the uniform direction results in each nub having a first length;
   a positive misalignment in the uniform direction results in each nub having a second length that is greater than the first length; and
   a negative misalignment in the uniform direction results in each nub having a third length that is less than the first length.

5. The method of claim 4, wherein:
   zero misalignment results in a first resistive value along the single electrical pathway;
   positive misalignment results in a second resistive value along the single electrical pathway that is greater than the first resistive value; and
   negative misalignment results in a third resistive value along the single electrical pathway that is less than the first resistive value.

6. The method of claim 5, wherein the step of determining the amount of misalignment based on the measured resistance includes the step of comparing the measured resistance to a known resistance value representative of the case of zero misalignment.

7. A method for identifying misalignments in an overlapping region of a stitched circuit in an integrated circuit fabrication process, comprising:
   creating a first circuit using a reference mask, wherein the first circuit includes a first part of an offset dependent resistor structure in the overlapping region;
   creating a second circuit using a secondary mask, wherein the second circuit includes a second part of the offset dependent resistor structure in the overlapping region,
   wherein the offset dependent resistor structure includes a plurality of nubs that interconnect the first part and the second part of the offset dependent resistor structure;
   measuring a resistance across the offset dependent resistor structure; and
   determining an amount of misalignment based on the measured resistance;
   wherein:
   one of the parts of the offset dependent resistor structure comprises a pair of open E-shaped substructures, each having two open terminal points; and
   the other part of the offset dependent resistor structure comprises three substructures that interconnect with the open terminal points of the E-shaped substructures to form a single electrical pathway when the two parts are superimposed.

8. The method of claim 7, wherein one of the parts of the offset dependent resistor structure comprises a pair of test pads.

9. The method of claim 7, wherein the first part and the second part of the offset dependent resistor structure interconnect via four nubs, wherein each nub is oriented in a uniform direction.

10. The method of claim 9, wherein:
    a zero misalignment in the uniform direction results in each nub having a first length; a positive misalignment in the uniform direction results in each nub having a second length that is less than the first length; and
    a negative misalignment in the uniform direction results in each nub having a third length that is greater than the first length.

11. The method of claim 10, wherein:
    zero misalignment results in a first resistive value along the single electrical pathway; positive misalignment results in a second resistive value along the single electrical pathway that is less than the first resistive value; and
    negative misalignment results in a third resistive value along the single electrical pathway that is greater than the first resistive value.

12. The method of claim 11, wherein the step of determining the amount of misalignment based on the measured resistance includes the step of comparing the measured resistance to a known resistance value determined for the case of zero misalignment.

13. An offset dependent resistor structure for identifying a misalignment in an overlapping region of a stitched portion of an integrated circuit, comprising:
    a first part of an offset dependent resistor structure created in the overlapping region using a reference mask;

a second part of the offset dependent resistor structure superimposed on the first part in the overlapping region using a secondary mask; and a plurality of nubs that interconnect the first part and the second part of the offset dependent resistor structure to form a single electrical pathway, wherein the resistance of the single electrical pathway is dependent upon the length of the nubs that interconnect the first part and the second part of the offset dependent resistor structure;

wherein:

the first part of the offset dependent resistor structure comprises a pair of open rectangular substructures, each having two open terminal points; and the second part of the offset dependent resistor structure comprises three substructures that interconnect with the open terminal points of the open rectangular substructures to form the single electrical pathway.

14. The offset dependent resistor structure of claim 13, further comprising a pair of test pads at ends of the single electrical pathway.

15. The offset dependent resistor structure of claim 13, wherein the first part and the second part of the offset dependent resistor structure interconnect via four nubs, wherein each nub is oriented in a uniform direction.

16. A system for measuring misalignments in an overlapping region of a stitched portion of an integrated circuit, comprising:

a first offset dependent resistor structure, including:
 a first part created in the overlapping region using a reference mask,
 a second part superimposed on the first part in the overlapping region and created using a secondary mask; and
 a plurality of nubs oriented in a first uniform direction that interconnect the first part and the second part to form a single electrical pathway, wherein the resistance of the single electrical pathway is dependent upon the length of the nubs that interconnect the first part and the second part,
 a system for measuring the resistance across the single electrical pathway; and a second offset dependent resistor structure, including:
 a first part created in the overlapping region using a reference mask,
 a second part created in the overlapping region using a secondary mask, and
 a plurality of second nubs oriented in a second uniform direction that interconnect the first part and the second part to form a single electrical pathway, wherein the second uniform direction is perpendicular to the first uniform direction.

17. The system of claim 16, wherein the system for measuring the resistance comprises a pair of test pads at the ends of the single electrical pathway and a pair of probes.

18. A method for identifying misalignments in an overlapping region of a stitched circuit in a integrated circuit fabrication process, comprising:

creating a first circuit using a reference mask, wherein the first circuit includes in the overlapping region a first part of a first offset dependent resistor structure and a first part of a second offset dependent resistor structure;

creating a second circuit using a secondary mask, wherein the second circuit includes in the overlapping region a second part of the first offset dependent resistor structure and a second part of the second offset dependent resistor structure, wherein the first offset dependent resistor structure includes a plurality of first nubs that interconnect the first part and the second part of the first offset dependent resistor structure, wherein the second offset dependent resistor structure includes a plurality of second nubs that interconnect the first part and the second part of the second offset dependent resistor structure, and wherein the first and second nubs are oriented in a uniform direction;

measuring a resistance across both the first and second offset dependent resistor structures; and determining an amount of misalignment based on the measured resistances.

19. The method of claim 18, wherein:

a zero misalignment in the uniform direction results in all of the first nubs and second nubs being substantially equal to a first length; and a non-zero misalignment in the uniform direction results in the first nubs having a length less than the first length and the second nubs having a length greater than the first length.

20. The method of claim 18, wherein a zero misalignment in the uniform direction results in the first and second offset dependent resistor structures having the same resistive values.

21. The method of claim 18, wherein a non-zero misalignment in the uniform direction results in the second offset dependent resistor structure having a resistive value that is substantially the negative of the resistive value of the first offset dependent resistor structure.

22. An offset dependent resistor structure for identifying a misalignment in an overlapping region of a stitched portion of an integrated circuit, comprising:

a first part of an offset dependent resistor structure created in the overlapping region using a reference mask;

a second part of the offset dependent resistor structure superimposed on the first part in the overlapping region using a secondary mask; and a plurality of nubs that interconnect the first part and the second part of the offset dependent resistor structure to form a single electrical pathway, wherein the resistance of the single electrical pathway is dependent upon the length of the nubs that interconnect the first part and the second part of the offset dependent resistor structure;

wherein:

the first part of the offset dependent resistor structure comprises a pair of open E-shaped substructures, each having two open terminal points; and the second part of the offset dependent resistor structure comprises three substructures that interconnect with the open terminal points of the E-shaped substructures to form a single electrical pathway.

23. An offset dependent resistor structure for identifying a misalignment in an overlapping region of a stitched portion of an integrated circuit, comprising:

a first part of an offset dependent resistor structure created in the overlapping region using a reference mask;

a second part of the offset dependent resistor structure superimposed on the first part in the overlapping region using a secondary mask; and a plurality of nubs that interconnect the first part and the second part of the offset dependent resistor structure to form a single electrical pathway, wherein the resistance of the single electrical pathway is dependent upon the length of the nubs that interconnect the first part and the second part of the offset dependent resistor structure;

wherein the first part and the second part of the offset dependent resistor structure interconnect via four nubs, wherein each nub is oriented in a uniform direction.

* * * * *